(12) United States Patent
Kang

(10) Patent No.: US 7,362,164 B2
(45) Date of Patent: Apr. 22, 2008

(54) SEMICONDUCTOR INTEGRATED CIRCUIT AND METHOD OF CONTROLLING INTERNAL VOLTAGE OF THE SAME

(75) Inventor: Sang Hee Kang, Gyeonggi-do (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 11/518,490

(22) Filed: Sep. 11, 2006

(65) Prior Publication Data
US 2007/0085594 A1    Apr. 19, 2007

(30) Foreign Application Priority Data
Sep. 12, 2005    (KR) .................. 10-2005-0084884

(51) Int. Cl.
*G05F 1/10* (2006.01)
(52) U.S. Cl. ..................................... 327/536
(58) Field of Classification Search .............. 327/534, 327/535, 536, 537
See application file for complete search history.

(56) References Cited
U.S. PATENT DOCUMENTS
6,876,247 B2    4/2005    Jang et al.
7,259,611 B2 *   8/2007   Tanimoto ................... 327/536
7,304,531 B2 *  12/2007   Kim .......................... 327/536

FOREIGN PATENT DOCUMENTS

| JP | 10-208489 | 8/1998 |
|---|---|---|
| JP | 10-284686 | 10/1998 |
| JP | 11-328956 | 11/1999 |
| JP | 2000-011648 | 1/2000 |
| JP | 2002-191169 | 7/2002 |
| JP | 2004-355788 | 12/2004 |
| KR | 1020000044594 A | 7/2000 |
| KR | 1020040093974 A | 11/2004 |
| KR | 1020050017732 A | 2/2005 |

* cited by examiner

*Primary Examiner*—Jeffrey Zweizig
(74) *Attorney, Agent, or Firm*—Venable, LLP; Jeffri A. Kaminski (57) ABSTRACT

A semiconductor integrated circuit includes: a elevated voltage detector that outputs a elevated voltage pump enable signal; a elevated voltage pump that is driven by the elevated voltage pump enable signal to pump the elevated voltage; a substrate bias voltage detector that outputs a substrate bias voltage control signal when at least one of the elevated voltage pump enable signal and a substrate bias voltage pump enable signal for driving a substrate bias voltage pump changes to an active state; and the substrate bias voltage pump that is driven by the substrate bias voltage control signal to pump the substrate bias voltage.

11 Claims, 7 Drawing Sheets

PRIOR ART

Fig. 1

PRIOR ART

Fig. 2

PRIOR ART

Fig. 3

PRIOR ART

SEMICONDUCTOR INTEGRATED CIRCUIT AND METHOD OF CONTROLLING INTERNAL VOLTAGE OF THE SAME

BACKGROUND OF THE INVENTION

1. Technical Field

The present invention relates to a semiconductor integrated circuit and a method of controlling an internal voltage of the same.

2. Related Art

A semiconductor integrated circuit uses various voltage levels, and power can be divided into two main types: external power (VDD and VSS) and internal power (VPP and VBB).

In other words, external power is supplied by an apparatus having a semiconductor integrated circuit mounted thereon, and internal power is supplied by converting the external power in the semiconductor integrated circuit.

In ascending order, the voltage levels are VPP, VDD, VSS, and VBB. VBB is a reverse bias voltage having an absolute value larger than that of the ground voltage VSS.

VPP is essentially used in a word line driver and a data-out driver in order to compensate for threshold voltage loss in a transistor constituting a memory cell of an integrated circuit. VPP is generated by boosting VDD and has a value larger than the sum of VDD and the threshold voltage VT.

The stability of the above-mentioned internal power has a great impact on the reliability and current consumption of a semiconductor integrated circuit. Therefore, in the design of a semiconductor integrated circuit, it is important to provide a stable supply of power within a predetermined range by controlling the power supply.

Hereinafter, a semiconductor integrated circuit according to the related art will be described with reference to FIGS. 1 to 4.

Figure 1:
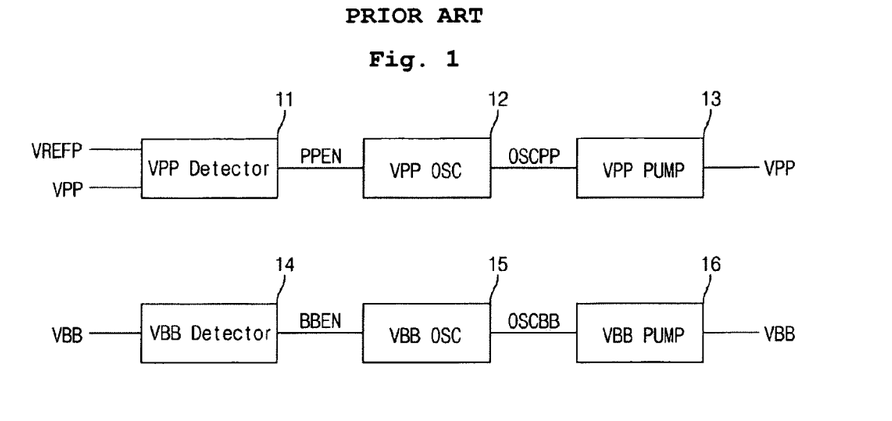
FIG. 1 is a block diagram showing the structure of a semiconductor integrated circuit according to the related art.
Figure 2:
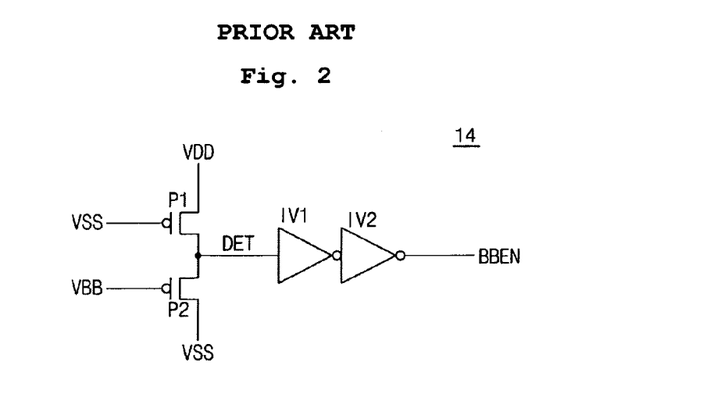
FIG. 2 is a circuit diagram showing the internal structure of a VBB detector of FIG. 1.
Figure 3:
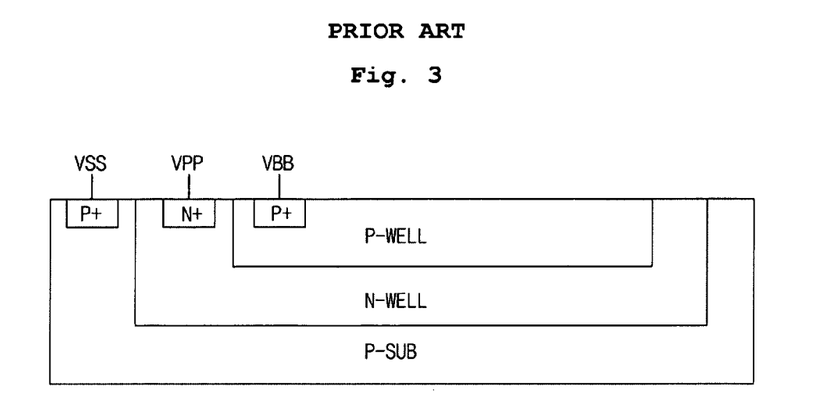
FIG. 3 is a cross-sectional view showing a well bias of the semiconductor integrated circuit.
Figure 4:
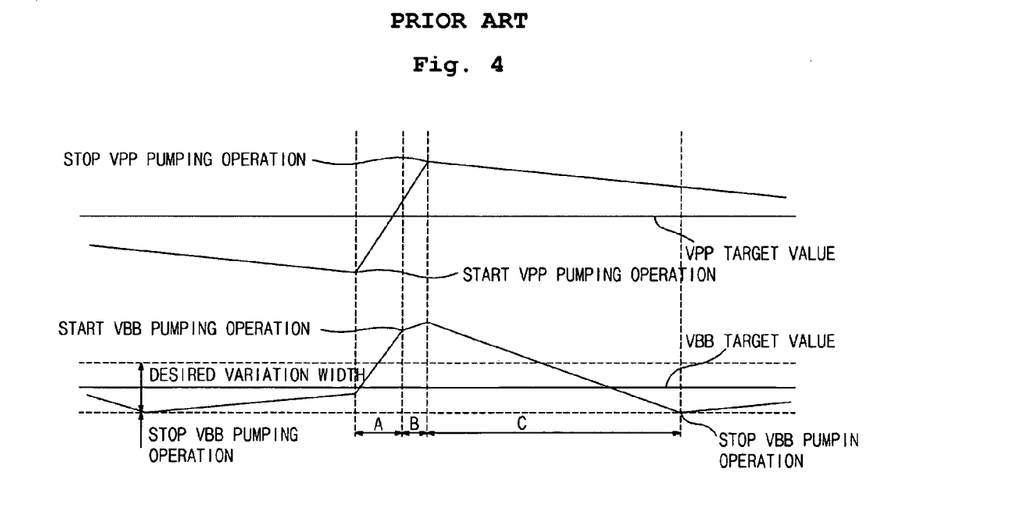
FIG. 4 is a waveform diagram showing change in VPP and VBB according to the related art.

FIG. 1 is a block diagram showing the structure of a semiconductor integrated circuit according to the related art. FIG. 2 is a circuit diagram showing the internal structure of a VBB detector 14 of FIG. 1. FIG. 3 is a cross-sectional view showing a well bias of the semiconductor integrated circuit. FIG. 4 is a waveform view showing change in VPP and VBB according to the related art.

In the semiconductor integrated circuit according to the related art, as shown in FIG. 1, a structure for controlling VPP and a structure for controlling VBB are separate from each other.

The structure for controlling VPP includes a elevated voltage detector (hereinafter, referred to as a VPP detector) 11, a VPP oscillator (VPP OSC) 12, and a elevated voltage pump (hereinafter, referred to as a VPP pump) 13.

The VPP detector 11 detects whether the level of VPP is lower than a predetermined value and outputs an enable signal PPEN (for example, a high-level signal) to drive the VPP pump 13.

The VPP oscillator 12 generates a pulse during a period when the enable signal PPEN output by the VPP detector 11 is at a high level.

The VPP pump 13 performs a pumping operation using a pulse OSCPP output from the VPP oscillator 12 so as to raise the level of VPP.

The structure for controlling VBB includes a substrate bias voltage detector (hereinafter, referred to as a VBB detector) 14, a VBB oscillator (VBB OSC) 15, and a substrate bias voltage pump (hereinafter, referred to as a VBB pump) 16.

The VBB detector 14 detects whether the level of VBB is higher than a predetermined value, and outputs an enable signal BBEN (for example, a 'high-level' signal) to drive the VBB pump 16.

An example of the internal structure of the VBB detector 14 is shown in FIG. 2, and is composed of two PMOS transistors P1 and P2 and two inverters IV1 and IV2. The VBB detector 14 is operated so that a control signal for the PMOS transistor P2 varies depending on the VBB level and the state of the output signal BBEN is determined to be 'high' or 'low' according to a difference between the control signals for PMOS transistors P1 and P2.

The VBB oscillator 15 generates a pulse OSCBB during a period when the enable signal BBEN output by the VBB detector 14 is at the high level.

The VBB pump 16 performs a pumping operation using the pulse OSCBB output from the VBB oscillator 15 such that the level of VBB is lowered. In other words, since VBB is a reverse bias, the pumping operation is performed such that the level of VBB increases in a negative direction.

The VPP pump 13 is designed to have a size larger than the VBB pump 16 so as to generate a VPP having a level higher than that of VDD (external voltage). Furthermore, the response time of the VBB detector 14 is longer than that of the VPP detector 11. That is, the response of the VBB detector 14 is later than that of the VPP detector 11.

A well bias of the semiconductor integrated circuit is configured as shown in FIG. 3. That is, an N-well to which the VPP is applied and a P-well to which the VBB is applied are adjacent to each other.

Therefore, the probability that coupling noise of VPP and VBB will occur due to a junction capacitor between the adjacent wells is very high.

In other words, as shown in FIG. 4, the VPP level rises when the VPP pump 13 operates, is gradually lowered after the operation of the VPP pump stops, rises when the VPP pump 13 operates again due to the set value detection of the VPP detector 11, and is then gradually lowered over time. This procedure is repeated.

When the level of VPP rises in sections A and B due to the operation of the VPP pump 13, the level of VBB also rises due to the above-mentioned coupling noise.

Even though the VBB pump 16 operates in section B to lower the level of VBB, since the VPP pump 13 is still operating, the VBB level increases a little. The level of VBB normally drops in section C, when the operation of the VPP pump 13 completely stops, until the operation of the VBB pump 16 stops.

In the semiconductor integrated circuit according to the related art, the size of the VPP pump 13 is larger than that of the VBB pump 16 and the response speed of the VBB detector 14 is slower than that of the VPP detector 11. Furthermore, coupling noise occurs due to a junction capacitor formed between the power supplies of the internal power supplies applied to adjacent regions.

As a result, when a high-level power supply voltage VPP rises, a relatively low-level substrate bias voltage VBB rises together with the high-level power supply voltage to deviate from a target value, resulting in an unstable power supply voltage.

Therefore, the semiconductor integrated circuit according to the related art has the following problems:

First, the operational reliability of the semiconductor integrated circuit deteriorates.

Second, current loss of a transistor constituting a memory cell of the semiconductor integrated circuit increases.

SUMMARY OF THE INVENTION

Accordingly, embodiments of the present invention provide a semiconductor integrated circuit with improved reliability by preventing the level of the substrate bias voltage from rising together with a elevated voltage level according to the variation of the elevated voltage level, and a method of controlling an internal voltage of the same.

Embodiments of the present invention also provide a semiconductor integrated circuit with minimal current loss, and a method of controlling an internal voltage of the same.

According to a first embodiment of the invention, a semiconductor integrated circuit uses, as internal voltages, a substrate bias voltage VBB and an elevated voltage VPP obtained by converting an external voltage. The semiconductor integrated circuit includes: an elevated voltage detector that outputs an elevated voltage pump enable signal; an elevated voltage pump that is driven by the elevated voltage pump enable signal to pump the elevated voltage; a substrate bias voltage detector that outputs a substrate bias voltage control signal when at least one of the elevated voltage pump enable signal and a substrate bias voltage pump enable signal for driving a substrate bias voltage pump changes to an active state; and the substrate bias voltage pump that is driven by the substrate bias voltage control signal to pump the substrate bias voltage.

According to a second embodiment of the invention, a semiconductor integrated circuit is provided that uses, as internal voltages, a substrate bias voltage VBB and a elevated voltage VPP obtained by converting an external voltage. The semiconductor integrated circuit includes: an elevated voltage detector that outputs an elevated voltage pump enable signal; an elevated voltage pump that is driven by the elevated voltage pump enable signal to pump the elevated voltage; a pulse generating unit that generates a pulse synchronized with the elevated voltage pump enable signal; a substrate bias voltage detector that outputs a substrate bias voltage control signal when at least one of the elevated voltage pump enable signal and a substrate bias voltage pump enable signal for driving a first substrate bias voltage pump changes to an active state; the first substrate bias voltage pump that is driven by the substrate bias voltage control signal to pump the substrate bias voltage; and a second substrate bias voltage pump that pumps the substrate bias voltage according to the pulse generated by the pulse generating unit, and outputs the pumped substrate bias voltage through an output node where the first and second substrate bias voltage pumps are connected to each other.

According to a third embodiment of the invention, a method of controlling the internal voltages of a semiconductor integrated circuit is provided that uses, as the internal voltages, a substrate bias voltage VBB and an elevated voltage VPP obtained by converting an external voltage. In the method, the level of the substrate bias voltage is pumped when a voltage control signal becomes active. In addition, the voltage control signal is in an active state for a period when at least one of an elevated voltage pump enable signal, for an elevated voltage pumping operation, that is output when the elevated voltage reaches a first predetermined value, and a substrate bias voltage pump enable signal, for a substrate bias voltage pumping operation, that is output when the substrate bias voltage reaches a second predetermined value, is active.

According to a fourth embodiment of the invention, a method of controlling internal voltages of a semiconductor integrated circuit is provided that uses, as the internal voltages, a substrate bias voltage VBB and an elevated voltage VPP obtained by converting an external voltage. In the method, the level of the substrate bias voltage is pumped when a voltage control signal becomes active. In addition, the voltage control signal is in an active state for a period where at least one of a elevated voltage pump enable signal, for an elevated voltage pumping operation, that is output when the elevated voltage reaches a first predetermined value, and a substrate bias voltage pump enable signal, for a substrate bias voltage pumping operation, that is output when the substrate bias voltage reaches a second predetermined value, is active, or is activated by a pulse that is activated in synchronization with the elevated voltage pump enable signal and is inactivated before the active period of the elevated voltage pump enable signal ends.

Therefore, according to embodiments of present invention, it is possible to improve the operational reliability of a semiconductor integrated circuit, and to reduce the current consumption by minimizing the current loss of a transistor constituting a cell.

DESCRIPTION OF EXEMPLARY EMBODIMENTS

Hereinafter, embodiments of a semiconductor integrated circuit and a method of controlling an internal voltage of the same according to the invention will be described with reference to the accompanying drawings.

Figure 5:
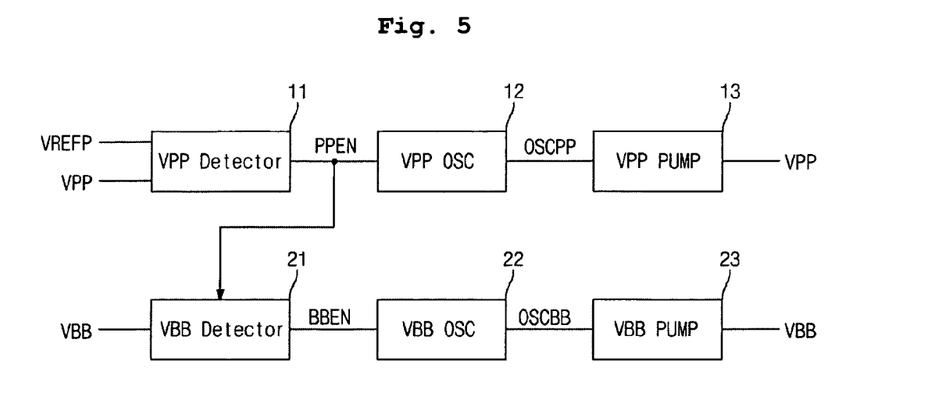
FIG. 5 is a block diagram showing the internal structure of a semiconductor integrated circuit according a first embodiment of the invention.
Figure 6:
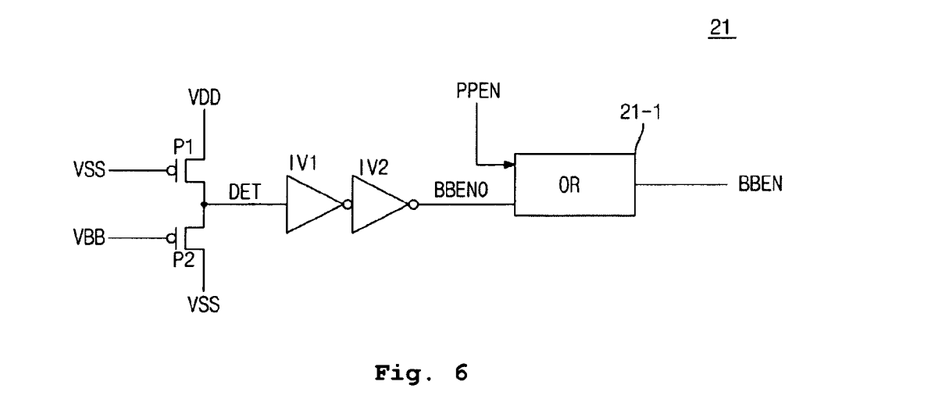
FIG. 6 is a circuit diagram showing the internal structure of a VBB detector of FIG. 5.
Figure 7:
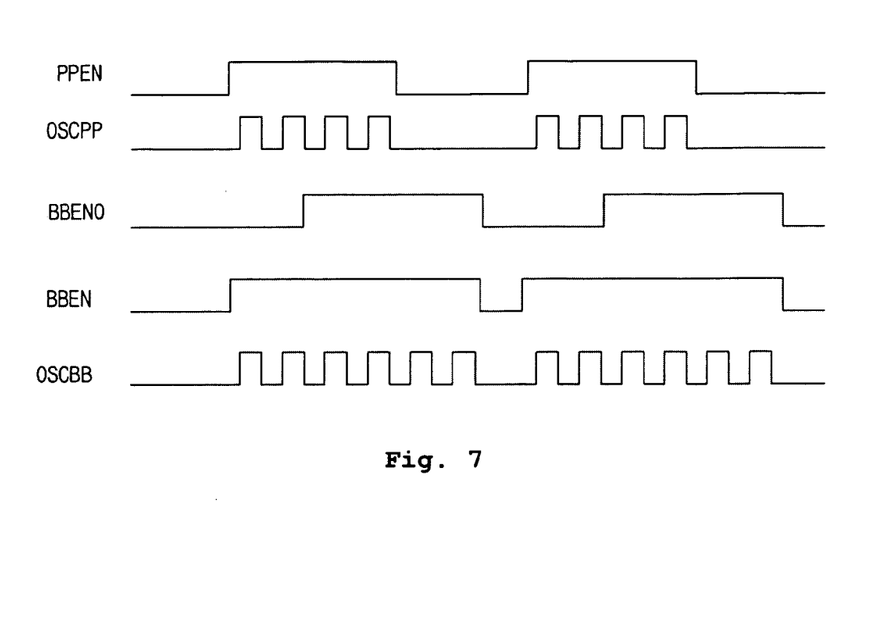
FIG. 7 is a timing chart illustrating the operation of each unit of FIG. 5.
Figure 8:
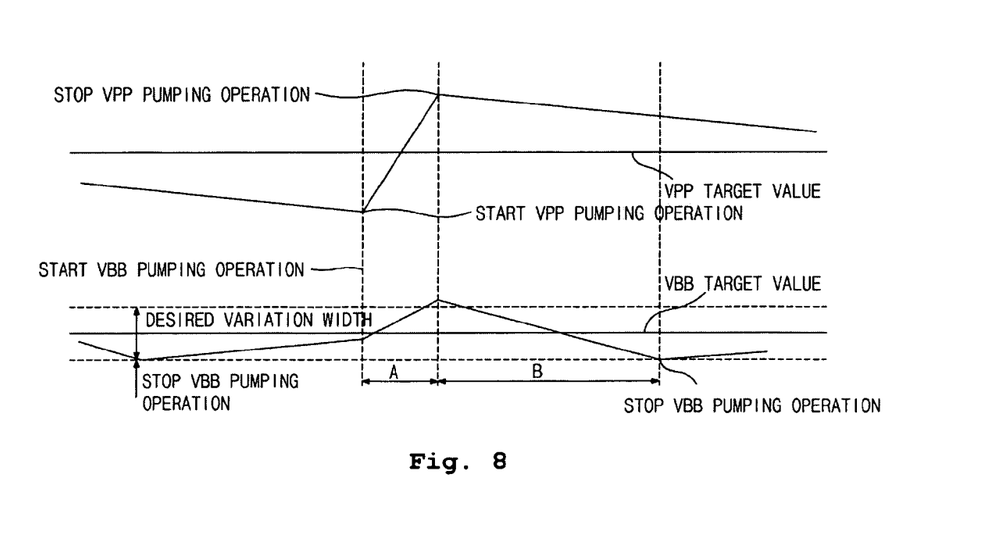
FIG. 8 is a waveform diagram showing change in a VPP and a VBB according to the first embodiment shown in FIG. 5.
Figure 9:
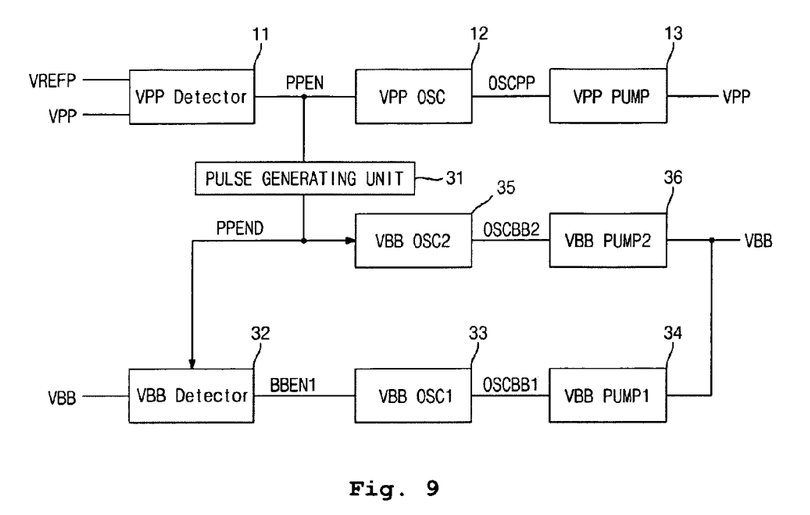
FIG. 9 is a block diagram showing the structure of a semiconductor integrated circuit according to a second embodiment of the invention.
Figure 10:
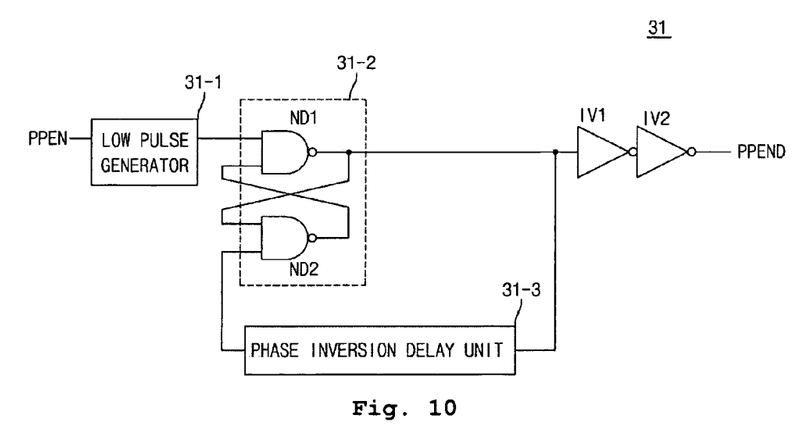
FIG. 10 is a circuit diagram showing the internal structure of a pulse generating unit of FIG. 9.
Figure 11:
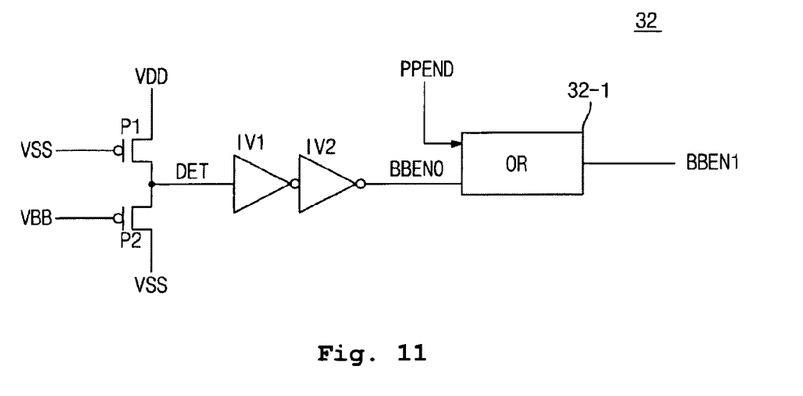
FIG. 11 is a circuit diagram showing the internal structure of a VBB detector of FIG. 9.
Figure 12:
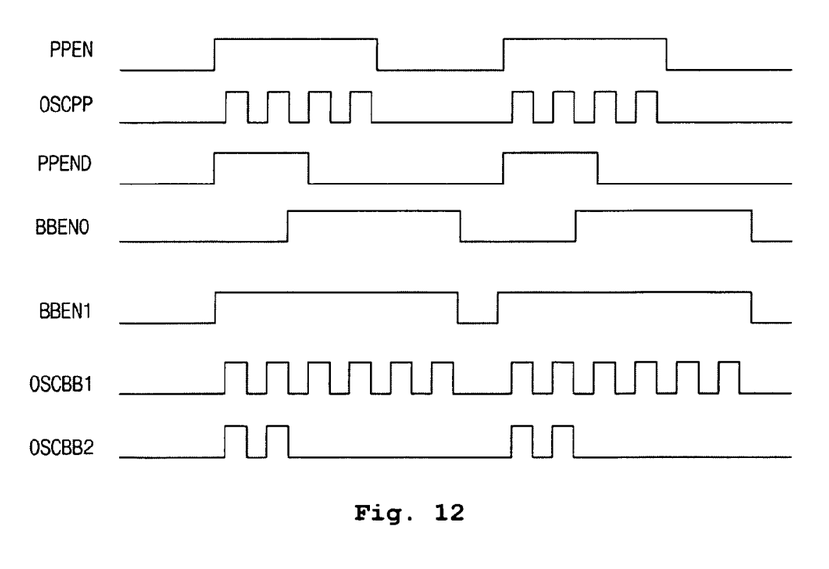
FIG. 12 is a timing chart illustrating the operation of each unit of FIG. 9.
Figure 13:
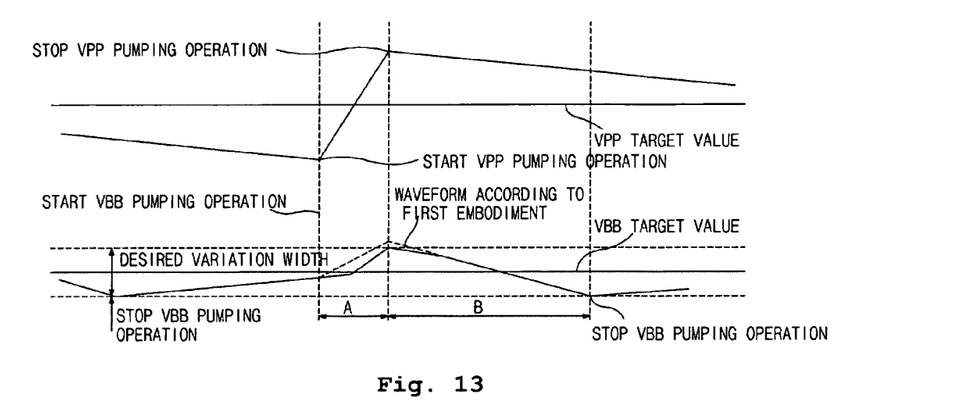
FIG. 13 is a waveform diagram showing change in VPP and VBB according to the second embodiment shown in FIG. 9.

FIG. 5 is a block diagram showing the structure of a semiconductor integrated circuit according to a first embodiment of the invention. FIG. 6 is a circuit diagram showing the internal structure of a VBB detector 21 shown in FIG. 5. FIG. 7 is a timing chart illustrating the operation of each unit of FIG. 5. FIG. 8 is a waveform diagram showing change in a VPP and a VBB according to FIG. 5. FIG. 9 is a block diagram showing the structure of a semiconductor integrated circuit according to a second embodiment of the invention. FIG. 10 is a circuit diagram showing the internal structure of a pulse generator of FIG. 9. FIG. 11 is a circuit diagram showing the internal structure of a VBB detector of FIG. 9. FIG. 12 is a timing chart illustrating the operation of each unit of FIG. 9. FIG. 13 is a waveform diagram showing change in a VPP and a VBB according to FIG. 9.

First Embodiment

As shown in FIG. 5, a semiconductor integrated circuit according to the first embodiment includes: a high-voltage detector (hereinafter, referred to as a VPP detector) 11, which detects whether an elevated voltage VPP exceeds a predetermined value and outputs a VPP pump enable signal PPEN according to the detection result; a substrate bias voltage detector (hereinafter, referred to as a VBB detector) 21 that detects whether a substrate bias voltage VBB exceeds a predetermined value and outputs a substrate bias voltage control signal BBEN on the basis of at least one of the output signal PPEN of the VPP detector 11 and a VBB pump enable signal BBENO (FIG. 6) according to the detection result; a VBB oscillator 22 that generates a pulse OSCBB for a period where the substrate bias voltage control signal BBEN output by the VBB detector 21 is 'active (high)'; and a substrate bias voltage pump (hereinafter, referred to as a VBB pump) 23 that pumps the substrate bias voltage level by using the pulse OSCBB output from the VBB oscillator 22 and outputs the pumped substrate bias voltage.

The VBB oscillator 22 can be integrally formed in the VBB pump 23. The VPP oscillator 12 and the VPP pump 13 have well-known structures, and thus a description thereof will be omitted. The VPP oscillator 12 may also be integrally formed in the VPP pump 13.

As shown in FIG. 6, the VBB detector 21 includes a first transistor P1, a second transistor P2, first and second inverters IV1 and IV2, and an OR gate 21-1. The drain of the first transistor P1 is connected to the source of the second transistor P2. A ground voltage VSS is applied to the gate of the first transistor P1, and an external voltage VDD is applied to the source of the first transistor P1. The substrate bias voltage VBB is applied to the gate of the second transistor P2, and the ground voltage VSS is applied to the drain of the second transistor P2. The first and second inverters IV1 and IV2 buffer an output signal of a node where the drain of the first transistor P1 is connected to the source of the second transistor P2. The OR gate 21-1 is a logic gate that performs the logic sum operation of an output BBENO of the second inverter IV2 and an output PPEN of the VPP detector 11.

According to the entire circuit design, the number of inverters IV1 and IV2 may increase or decrease.

The operation of the semiconductor integrated circuit having the above-mentioned structure will be described in detail.

First, as shown in FIG. 7, the VBB detector 21 outputs the enable signal BBEN that is obtained by performing a logic sum operation of the output signal PPEN of the VPP detector 11 and the output BBENO of the second inverter IV2 by means of the OR gate 21-1.

The output signal PPEN is an enable signal for driving the VPP pump 13 to prevent the level of the voltage VPP from dropping below a predetermined value. The output signal BBENO is an enable signal for driving the VBB pump 23 to prevent the level of the voltage VBB from rising over a predetermined value.

The VBB oscillator 22 outputs the pulse OSCBB when the signal BBEN is in an active (high) state.

The VBB pump 23 performs a pumping operation using the pulse OSCBB such that the VBB level drops, that is, the VBB level increases in the negative direction.

In this way, when the VPP pump 13 performs a pumping operation using the output signal PPEN of the VPP detector 11, the VBB pump 23 also operates so as to prevent the VBB level from abnormally rising.

In the related art, as shown in FIG. 4, since the VBB pump does not operate when the VPP pump performs the pumping operation, the VBB level also rises. However, according to the first embodiment of the invention, since the VBB pump 23 also operates when the VPP pump 13 operates, a rising gradient of the VBB is markedly reduced, as shown in FIG. 8.

Second Embodiment

As shown in FIG. 9, a semiconductor integrated circuit according to a second embodiment of the invention includes a high-voltage detector 11 (hereinafter, referred to as a VPP detector), a pulse generating unit 31, a substrate bias voltage detector 32 (hereinafter, referred to as a VBB detector), a first VBB oscillator 33, a first substrate bias voltage pump 34 (hereinafter, referred to as a first VBB pump), a second VBB oscillator 35, and a second substrate bias voltage pump 36 (hereinafter, referred to as a second VBB pump).

The VPP detector 11 detects whether an elevated voltage VPP exceeds a predetermined value and outputs a VPP pump enable signal PPEN according to the detection result. The pulse generating unit 31 generates a pulse PPEND having a narrow width that becomes active in synchronization with a rising edge of the output signal PPEN of the VPP detector 11 and becomes inactive before an active period of the output signal PPEN ends. The VBB detector 32 detects whether the substrate bias voltage VBB exceeds a predetermined value and outputs a substrate bias voltage control signal BBEN1 on the basis of at least one of the output pulse PPEND of the pulse generating unit 31 and a VBB pump enable signal BBENO (FIG. 11) according to the detection result. The first VBB oscillator 33 generates a pulse OSCBB1 for a period where the substrate bias voltage control signal BBEN1 output by the VBB detector 32 is in an active state. The first VBB pump 34 pumps the level of VBB by using the pulse OSCBB1 output by the first VBB oscillator 33 and outputs the pumped VBB. The second VBB oscillator 35 generates a pulse OSCBB2 for a period where the output pulse PPEND of the pulse generating unit 31 is in an active (high) state. The second VBB pump 36 pumps the level of the VBB by using the pulse OSCBB2 output from the second VBB oscillator 35 and outputs the pumped VBB through a node where the first and second VBB pumps 34 and 36 are connected to each other.

The first and second VBB oscillators 33 and 35 may be integrally formed inside the first and second VBB pumps 34 and 36, respectively. The VPP oscillator 12 and the VPP pump 13 have well-known structures, and thus a description thereof will be omitted. The VPP oscillator 12 may also be integrally formed inside the VPP pump 13.

The pulse generating unit 31 generates the pulse PPEND that has a width narrower than the enable signal PPEN and becomes active in synchronization with the enable signal PPEN such that the first and second VBB pumps 34 and 36 operate together at the beginning of the operation of the VPP pump 13.

The pulse generating unit 31 includes a low pulse generator 31-1, a latch 31-2, a phase inversion delay unit 31-3, and first and second inverters IV1 and IV2, as shown in FIG. 10. The low pulse generator 31-1 generates a low pulse when the output signal PPEN of the VPP detector 11 changes to a high level. The latch 31-2 maintains a predetermined signal level (high) according to the output of the low pulse generator 31-1. The phase inversion delay unit 31-3 inverts the phase of the output signal of the latch 31-2, delays the inverted signal by a predetermined amount of time, and feeds back the delayed signal to the latch 31-2. The first and second inverters IV1 and IV2 buffer the output of the latch 31-2.

The latch 31-2 has a first NAND gate ND1 and a second NAND gate ND2. The output of the low pulse generator 31-1 is input to a first input terminal of the first NAND gate ND1. The output of the first NAND gate ND1 is input to a first input terminal of the second NAND gate ND2, and the output of the phase inversion delay unit 31-3 is input to a second input terminal of the second NAND gate ND2. The output of the second NAND gate ND2 is input to a second input terminal of the first NAND gate ND1.

According to the entire circuit design, the number of inverters V1 and V2 may increase or decrease.

The VBB detector 32 includes a first transistor P1, a second transistor P2, first and second inverters IV1 and IV2, and an OR gate 32-1, as shown in FIG. 11. A ground voltage VSS is applied to the gate of the first transistor P1 and an external voltage VDD is applied to the source of the first transistor P1. The substrate bias voltage VBB is applied to the gate of the second transistor P2 and the ground voltage VSS is applied to the drain of the second transistor P2. The drain of the first transistor P1 is connected to the source of the second transistor P2. The first and second inverters IV1 and IV2 buffer an output signal from a node where the drain of the first transistor P1 is connected to the source of the second transistor P2. The OR gate 32-1 outputs the logic sum of the output signal BBENO of the second inverter IV2 and the output signal PPEND of the pulse generating unit 31.

According to the entire circuit design, the number of inverters V1 and V2 may increase or decrease.

The operation of the semiconductor integrated circuit having the above-mentioned structure will be described below in detail.

First, as shown in FIG. 12, the VBB detector 32 outputs the substrate bias voltage control signal BBEN1 that is obtained by performing a logic sum operation of the output signal PPEND of the pulse generating unit 31 and the signal BBEN0 detected by the VBB detector 32 by means of the OR gate 32-1.

The first VBB oscillator 33 outputs the pulse OSCBB1 for a period when the substrate bias voltage control signal BBEN1 is in an active (high) state.

The first VBB pump 34 performs a pumping operation using the pulse OSCBB1 so that the VBB level drops, that is, increases in the negative direction.

The second VBB oscillator 35 outputs the pulse OSCBB2 for a period when the pulse PPEND is in an active (high) state.

The second VBB pump 36 performs a pumping operation using the pulse OSCBB2 so as to increase the falling gradient of the level of the VBB output from the output terminal that is connected to the first pump 34.

As described above, in the semiconductor integrated circuit according to the second embodiment of the invention, the first and second VBB pumps 34 and 36 are simultaneously operated at the initial period of the operation of the VPP pump 13 using the output PPEND of the pulse generating unit 31 corresponding to the initial period of the output PPEN of the VPP detector 11. Therefore, it is possible to minimize the abnormal rising of the VBB level. Then, the first VBB pump 34 operates according to the waveform of the pulse OSCBB1. However, since the VBB level rises the most during the beginning of the operation of the VPP pump 13, the second VBB pump 36 is simultaneously operated with the first VBB pump 34 for only the initial period of the operation of the VPP pump 13 such that the output level of the VBB is remarkably lowered.

In the related art, since the VBB pump does not operate when the VPP pump is operating, the VPP level and the VBB level increase, as shown in FIG. 4. However, in the semiconductor integrated circuit according to the second embodiment of the invention, since the first and second VBB pump 34 and 36 operate when the VPP pump 13 operates, the level of the VBB further drops, as shown in FIG. 13.

In FIG. 13, the waveform represented by a dotted line indicates a VBB gradient according to the first embodiment of the invention. As can be seen from FIG. 13, in the second embodiment of the invention, an increase in the VBB level is prevented, as compared to the first embodiment.

As described above, the second embodiment of the invention can further prevent the increase in the VBB level due to an increase in the VPP level, as compared to the first embodiment of the invention. However, the second embodiment of the invention needs to additionally have the second VBB oscillator 35 and the second VBB pump 36.

Therefore, the first and second embodiments of the invention can be selectively applied in order to prevent an increase in the VBB level while reducing the number of components to a minimum, and in order to prevent an increase in the VBB level even when additional components are provided.

Although the present invention has been described in connection with the exemplary embodiments of the present invention, it will be apparent to those skilled in the art that various modifications and changes may be made without departing from the scope and spirit of the invention. Therefore, it should be understood that the above-described embodiments are not limitative, but illustrative in all aspects. The scope of the present invention is defined by the appended claims rather than by the description preceding them, and therefore all changes and modifications that fall within the metes and bounds of the claims, or equivalents of such metes and bounds are therefore intended to be embraced by the claims.

As described above, the semiconductor integrated circuit and the method of controlling the internal voltage of the same according to any one of the embodiments of the invention can stably maintain the level of the substrate bias voltage VBB regardless of an increase in the level of the elevated voltage VPP. Therefore, the above-described embodiments may have the following effects.

First, it is possible to improve the operational reliability of a semiconductor integrated circuit.

Second, it is possible to reduce total power consumption by minimizing the current loss of the transistors constituting memory cells of a semiconductor integrated circuit.

What is claimed is:

1. A semiconductor integrated circuit that uses, as internal voltages, a substrate bias voltage VBB and an elevated voltage VPP obtained by converting an external voltage, comprising:
   an elevated voltage detector that outputs an elevated voltage pump enable signal;
   an elevated voltage pump that is driven by the elevated voltage pump enable signal to pump the elevated voltage;

a substrate bias voltage detector that outputs a substrate bias voltage control signal when at least one of the elevated voltage pump enable signal and a substrate bias voltage pump enable signal changes to an active state; and a substrate bias voltage pump that is driven by the substrate bias voltage control signal to pump the substrate bias voltage.

2. The semiconductor integrated circuit of claim 1, wherein the substrate bias voltage detector includes:

a node having an output signal;

a first transistor having a drain, a gate supplied with a ground voltage VSS and a source supplied with an external voltage VDD;

a second transistor having a gate supplied with the substrate bias voltage VBB, a source connected to the drain of the first transistor at the node, and a drain supplied with a ground voltage VSS; and a logic gate that calculates a logic sum of the elevated voltage pump enable signal and the output signal of the node and outputs the logic sum.

3. The semiconductor integrated circuit of claim 2, wherein the first and second transistors are PMOS transistors.

4. A semiconductor integrated circuit that uses, as internal voltages, a substrate bias voltage VBB and an elevated voltage VPP obtained by converting an external voltage, comprising:

an elevated voltage detector that outputs an elevated voltage pump enable signal;

an elevated voltage pump that is driven by the elevated voltage pump enable signal to pump the elevated voltage;

a pulse generating unit that generate an output pulse having a width and synchronized with the elevated voltage pump enable signal;

a substrate bias voltage detector that outputs a substrate bias voltage control signal when at least one of the elevated voltage pump enable signal and a substrate bias voltage pump enable signal changes to an active state;

a first substrate bias voltage pump that is driven by the substrate bias voltage control signal to pump the substrate bias voltage; and a second substrate bias voltage pump coupled to the first substrate bias voltage pump at an output node and that pumps the substrate bias voltage according to the output pulse generated by the pulse generating unit, and outputs a pumped substrate bias voltage through the output node.

5. The semiconductor integrated circuit of claim 4, wherein the output pulse of the pulse generating unit changes to an active state in synchronization with the elevated voltage pump enable signal, and changes to an inactive state before a period for which the elevated voltage pump enable signal is in an active state ends.

6. The semiconductor integrated circuit of claim 4, wherein the pulse generating unit includes:

a pulse generator that generates an output signal by inverting the elevated voltage pump enable signal in synchronization with the output signal of the elevated voltage detector;

a latch providing an output signal having a phase and that maintains a predetermined signal level according to the output of the pulse generator; and a phase inversion delay unit that inverts the phase of an output signal of the latch, delays the inverted output signal by a predetermined amount of delay time, and feeds back the delayed signal to the latch.

7. The semiconductor integrated circuit of claim 6, wherein the width of the output pulse from the pulse generating unit is determined by the delay time of the phase inversion delay unit.

8. The semiconductor integrated circuit of claim 4, wherein the substrate bias voltage detector includes:

a first transistor that has a drain, a gate supplied with a ground voltage VSS and a source supplied with an external voltage VDD;

a second transistor which has a gate supplied with the substrate bias voltage VBB, a source connected to the drain of the first transistor, and a drain supplied with a ground voltage VSS;

a node where the drain of the first transistor is connected to the source of the second transistor; and a logic gate that calculates a logic sum of the output pulse generated by the pulse generating unit and a signal output from the node.

9. The semiconductor integrated circuit of claim 8, wherein the first and second transistors are PMOS transistors.

10. A method of controlling internal voltages of a semiconductor integrated circuit that uses, as the internal voltages, a substrate bias voltage VBB and an elevated voltage VPP obtained by converting an external voltage, the method comprising;

pumping a level of the substrate bias voltage when a voltage control signal becomes active, and placing the voltage control signal in an active state for a period when at least one of an elevated voltage pump enable signal, for an elevated voltage pumping operation, that is output when the elevated voltage reaches a first predetermined value, and a substrate bias voltage pump enable signal, for a substrate bias voltage pumping operation, that is output when the substrate bias voltage reaches a second predetermined value, is active.

11. A method of controlling internal voltages of a semiconductor integrated circuit that uses, as the internal voltages, a substrate bias voltage VBB and an elevated voltage VPP obtained by converting an external voltage, comprising:

pumping a level of the substrate bias voltage when a voltage control signal becomes active, and placing the voltage control signal is in an active state for a period when at least one of an elevated voltage pump enable signal, for an elevated voltage pumping operation, that is output when the elevated voltage reaches a first predetermined value and a substrate bias voltage pump enable signal, for a substrate bias voltage pumping operation, that is output when the substrate bias voltage reaches a second predetermined value, is active or is activated by a pulse that is activated in synchronization with the elevated voltage pump enable signal and is inactivated before the active period of the elevated voltage pump enable signal ends.

* * * * *